United States Patent [19]

Hiniker et al.

[11] 4,247,913
[45] Jan. 27, 1981

[54] PROTECTION CIRCUIT FOR STORAGE OF VOLATILE DATA

[75] Inventors: Thomas K. Hiniker, Mankato; Vincent N. Bush, Madison Lake, both of Minn.

[73] Assignee: Hiniker Company, Mankato, Minn.

[21] Appl. No.: 37,743

[22] Filed: May 10, 1979

[51] Int. Cl.³ .............................................. G11C 7/02
[52] U.S. Cl. ...................................... 365/228; 365/226
[58] Field of Search ................ 365/226, 227, 228, 229

[56] References Cited

U.S. PATENT DOCUMENTS

| | | | |
|---|---|---|---|
| 3,479,650 | 11/1969 | Montgomery | 365/228 |
| 4,096,560 | 6/1978 | Footh | 365/228 |
| 4,145,761 | 3/1979 | Gunter et al. | 365/226 |

FOREIGN PATENT DOCUMENTS 2531510 2/1977 Fed. Rep. of Germany ........... 365/228

Primary Examiner—Stuart N. Hecker
Attorney, Agent, or Firm—Merchant, Gould, Smith, Edell, Welter & Schmidt

[57] ABSTRACT

A protected memory circuit for use with an electronic data system includes a memory element such as a shift register, and memory control or lock means to selectively control enablement of the memory element for read/write operations. A separate power supply which may be a charged capacitor is used to power the memory and memory lock circuits in case of a power interruption in the main system with which the memory is being used, so that volatile data can be stored for re-use by the main system after the main power is restored. The lock includes a counter and a gate for inhibiting clock pulses to the memory element until a predetermined number of control pulses have been received to initiate a read/write operation. At all other times the clock input is blocked or clamped to prevent spurious signals or power surge transients from altering the stored data.

10 Claims, 3 Drawing Figures

PROTECTION CIRCUIT FOR STORAGE OF VOLATILE DATA

TECHNICAL FIELD OF THE INVENTION

The invention pertains to the field of electronic systems for data processing, handling, monitoring and calculation. More specifically, the invention pertains to an improved memory circuit having a locking circuit especially well adapted for use in connection with an electronic data system, for storage of volatile data associated therewith.

BACKGROUND OF THE PRIOR ART

Digital electronic systems have been applied to a great number of fields, for performing a wide variety of functions including monitoring, control and testing, and the processing, transmitting, receiving and handling of data. In many applications of digital systems, memory circuits are used for the storage of digital data, either on a short term or long term basis. One particular application for memories, to which the present invention is especially adapted, is the use of a temporary memory for the storage of volatile data. An example of this type of application is in association with a computer, wherein certain data and programs are stored in more or less permanent form, for example magnetic tape, but certain other data is stored for a short term in the electronic memory within the computer. This memory is said to be volatile, in the sense that in the case of a power interruption to the computer, the data previously stored in electronic memory would be lost. Recognizing the need for a way to preserve this volatile data in the event of a power interruption in order to avoid loss of data and the resulting disruption and complication in start-up procedure, the prior art has provided means for storing important volatile data in the event of such an interruption. In large digital computers, circuits are often provided for sensing an impeding loss of power supply, and for interrupting the normal program to save the contents of the volatile memory by transferring it quickly to a separate memory, or to magnetic memory in a brief instant before the loss disables the computer.

A similar need for storage of volatile data exists with respect to smaller computer systems, for example microcomputer systems, but cost consideration for user devices employing smaller computers or microprocessors often prevents use of the volatile memory storage techniques employed in larger computers. An example would be in a monitoring or control device employing a microprocessor. Typically, the program for the microprocessor, together with certain numerical constants or values employed in calculation in its program, are stored in some type of read only memory (ROM). The ROM is not affected by any interruption of power to the microprocessor, so the bulk of the program and important data is already in non-volatile memory. However, typically the microprocessor system receives certain operating data from sensors, for example, which data is to be counted, stored, displayed, or used in calculations, depending upon the intended use for the device. Such data is commonly stored in random access memory (RAM) within the microprocessor, and this type of electronic RAM memory is lost upon interruption of power to the microprocessor circuits. Such a power interruption might occur unexpectedly due to a failure somewhere in the source of power for the device, or it may occur intentionally as where the device is turned off for a period of time with the intention of resuming the same monitoring, calculations, process, etc. later using data previously developed.

With the development of complementary metal oxide semiconductor (CMOS) devices which are noted for their very low power drain, it has become common to provide an auxiliary CMOS memory for storage of data for a microprocessor, and the CMOS memory device can be powered from a separate small battery, or even from a large capacitor normally charged from the power supply but operative to supply energizing current to the CMOS memory for a certain period of time following removal of the main power supply. Although these techniques are generally successful, a problem still remains in that part of the data can be lost, or spurious data can be inserted in the memory due to voltage spikes or other transients occurring during shut-down or start-up of the mircoprocessor and associated components during and following a power failure. Also, in the case of a system operating on a vehicle such as a tractor, automobile, boat, airplane, etc. power is generally received from the vehicle's battery and generator or alternator, and these sources are notoriously noisy with interference and spurious signals that can interfere with the intended operation of the memory for the volatile data.

SUMMARY OF THE INVENTION

The present invention provides a protected memory circuit for use with an electronic data system, especially adapted for storage of volatile data and rejecting spurious signals that might accompany a power interruption, for example. The invention includes a memory for storage of the electronic data, including input and output means for connection to the electronic data system for transfer of data therebetween. Means are provided in association with the memory for selectively inhibiting or enabling the memory with respect to the input, or the output of data. Memory control means are provided in conjunction to the inhibiting and enabling means of the memory, the control means being adapted to receive control pulses from the electronic data system with which the memory is being used. The control means normally inhibit the memory, but upon receiving a predetermined number of control pulses the control means enables the memory means for the input or output of data.

According to a preferred embodiment of the invention, a shift register is used for the memory means, with data being serially loaded in the shift register for storage. In this embodiment the memory control means includes a lock having a counter for registering the number of control pulses received, and gating means connected to control application of clock signals to the shift register. In this manner the memory can be inhibited from accepting and shifting data by preventing the clock signals from enabling the shift register.

DETAILED DESCRIPTION OF THE INVENTION

Figure 1:
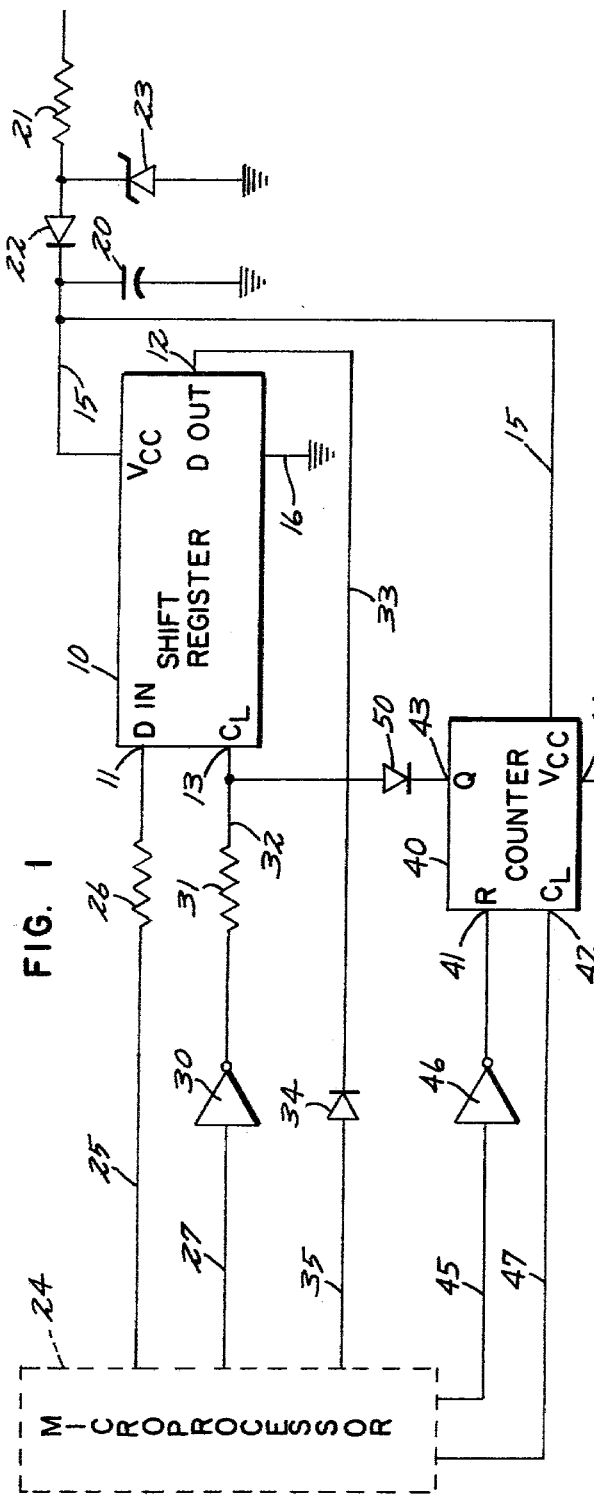
FIG. 1 is a schematic diagram in partial block diagram form showing a preferred embodiment of the invention operating in conjunction with a microprocessor.

Referring to FIG. 1, a shift register 10 is use as the memory element for the preferred embodiment of the invention, although other types of registers or memory elements could be used also. Shift register 10 may be any type of known shift register design, containing any number of stages as required to match the number of data bits to be stored in a given application. In the preferred embodiment, an integrated circuit CMOS 128 shift register is used, although it will be understood that any type of known shift register containing any number of stages can be used as required for a given application. Shift register 10 has an input 11 for receiving data at the first stage, and an output 12 for delivering stored data from the last stage of the shift register. Register 10 also includes a clock input 13 for receiving clock pulses that enable data to be stored from the input 11, and to cause the shift register to shift data successively through the register in the conventional manner.

The operating power for register 10 is applied via lead 15 to the Vcc power input to the register. A suitable ground connection is provided as indicated by reference number 16.

The power to the memory circuit is provided indirectly from the power supply for the electronic data system with which the invention is being used via a storage capacitor 20. Power from the power supply for the system (not shown) is received through resistor 21 and diode 22 which connects to lead 15 and storage capacitor 20. A Zener diode 23 may be included if necessary to further limit and stabilize the voltage applied to the circuit, and to protect it from possible large fluctuations during shut-down or start-up of the main power supply of the system from which resistor 21 connects.

In FIG. 1, microprocessor 24 is part of the electronic data system, in conjunction with which the present invention operates, and for this reason microprocessor 24 is shown in broken line. Microprocessor 24 typically would include many input/output ports, and auxiliary circuits according to the particular functions for which it is intended, but these are not shown as they do not form part of the present invention. Several ports of microprocessor 24 which do interfere with the invention of FIG. 1 are shown. One port connects via lead 25 and resistor 26 to data input 11. Another port connects via lead 27, inverter 30, resistor 31 and lead 32 to clock input 13 of the shift register. Resistors 26 and 31 may or may not be required, depending upon the electrical characteristics of the circuits which they connect. Also, inverter 30 may or may not be required, depending upon the polarity of the signals delivered by the microprocessor and required by the clock input to shift register 10.

Data appearing at the output 12 of the shift register is conveyed by lead 33, diode 34 and lead 35 to another port of microprocessor 24. Diode 34 may or may not be required, depending upon the electrical characteristics of devices 10 and 24, for isolation purposes.

A counter 40 is provided for controlling shift register 10. Counter 40 has a reset input 41, a clock input 42, and an output 43 which represents the output for a predetermined count of the counter. A power connection to the Vcc input is provided by a branch of lead 15, and a suitable power ground 44 is provided. A port of microprocessor 24 delivers reset pulses to input 41 by means of a lead 45 and an inverter 46, which may or may not be required, depending upon the polarity of the logic signals required in a given application. Another port of microprocessor 24 connects to input 42 by means of lead 47.

To operate shift register 10 as a memory device in a read/write operation, clock pulses are applied to input 13 simultaneously with applying successive data bits to input 11. On each clock pulse the applied data bit is stored and all previous data bits are shifted in the register, in the conventional manner. This process can be repeated up to the full capacity of the shift register to store the necessary data. Readout of stored data is accomplished in the same manner, and can be accomplished simultaneously with storing of data. On each clock pulse successive bits appear at output 12, where they may be read into the data system, represented by microprocessor 24.

In case of an interruption of the power to microprocessor 24 and associated components (not shown) of the data system, volatile data in process in the microprocessor can be shifted into shift register 10 for storage, as it will continue to be powered by the energy stored in capacitor 20. This storage of volatile data can be utilized, for example, in the case of the occurrence of a failure in the power source which supplies power to the data system. A sensor can be provided as is known in the prior art to detect this failure and to signal an interrupt condition. The microprocessor then has time by vitue of the energy stored in the voltage regulator, filtering, etc. circuits which supply it directly with power, to effect a subroutine which stores certain key data in a predetermined serial fashion into shift register 10, prior to complete loss of power and cessation of operation of microprocessor 24. Alternatively, the storage subroutine could be provided as part of an intentional turning off of the microprocessor and data system, with the intention of resuming operation later, at which time the contents of register 10 can be fed back into the microprocessor so that operation can resume utilizing data previously developed.

As an example, the preferred embodiment of the invention shown in FIG. 1 has been successfully used in a monitoring and calculation system intended for mounting on a farm tractor. Various sensors provide data to the microprocessor concerning distance traveled and quantity of fertilizer or insecticide delivered through a spraying apparatus. The microprocessor and associated circuits receive their power from the electrical system of the tractor, via suitable filtering and regulating circuits. In the case of a failure in the electrical system of the tractor, or in the case of an intentional shutting off of the monitoring system by the farmer for resumption of the monitoring operation later, certain key volatile data are stored in shift register 10 as described above. This enables rapid start-up without the inconvenience of loss of accumulated count data such as area traveled or quantity sprayed, or without the necessity of having to re-enter initial data such as starting capacity, width of spraying implement, and the like.

However, without the provision of a locking function for register 10 as provided by counter 40 and associated components, there would be a possibility of disruption of the operation of register 10 due to the occurrence of electrical noise, interference, and other spurious signals.

Such unwanted signals can occur, for example in the farm tractor example mentioned above, due to r-f radiation or coupling through the power supply of voltage spikes of other impulses originating in the electrical system of the tractor. Another source of unwanted troublesome signals may be the unpredictable generation of spurious signals by the microprocessor, logic gates, or other electronic components during the decay of power supply to the various circuits in a power interruption, or during the transitional build up of power to normal levels during a restoration of power. Whatever the source, the spurious signals could have the effect of loading meaningless signals into shift register 10, and more importantly of shifting good data out of the register, in which case it is lost. This could be caused by the occurrence of spurious pulses at input 13 of the shift register which would cause the register to shift, writing in whatever logic level happened to be present at the moment at input 11 and losing whatever data bit was stored at the final stage of the shift register at that time.

To prevent this unwanted action, a gating circuit is provided to control the clock input of the shift register. In the preferred embodiment, the gating circuit consists of diode 50 in conjunction with the output 43 of counter 40. When output 43 is at a low voltage or logical zero state, lead 32 is effectively clamped to the low logic level, thus preventing occurrence of any signals at the clock input 13 of the shift register which might otherwise be interpreted as clock signals and cause unwanted shifting of the register. When the output 43 of counter 40 switches to a logical one or high voltage state, the clamp is removed from lead 32, allowing normal clock pulses to be transmitted to the clock input 13. Of course, it will be appreciated that rather than using diode 50, any other type of logic gate could be inserted in lead 32 prior to input 13, for control by the output of counter 40.

The switching of logic states for output 43 is controlled by the design of the counter and the number of clock pulses applied thereto at lead 42. The counter can be chosen to respond to any predetermined number of pulses, either by counting up to the predetermined count or by presetting a number and counting down a predetermined number of pulses. In the preferred embodiment, for example, a 128 bit counter is used for counter 40. This predetermined number provides a high enough count so as to make it for all practical purposes immune to spurious interference. Following reset of the counter by pulse at input 41, output 43 is at a low level, and remains at that level until 128 pulses, or whatever other predetermined number has been chosen in the design of counter 40, is received at clock input 42.

Figure 2:
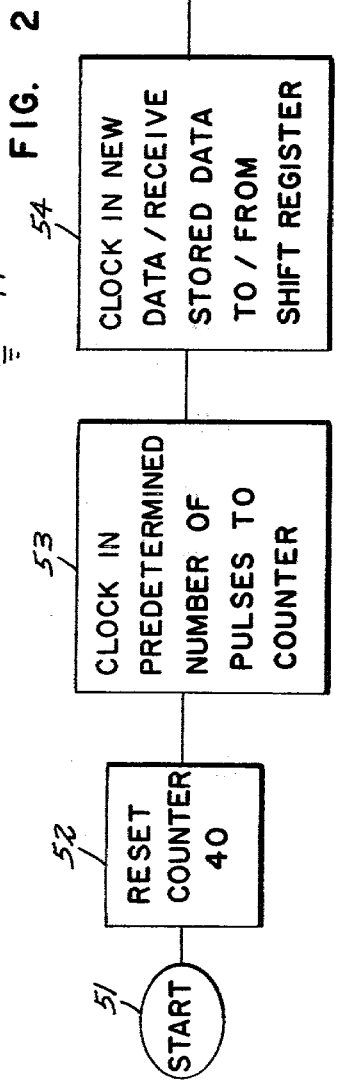
FIG. 2 is a simplified flowchart for the unlocking and operation of the memory protection circuit of FIG. 1.

The manner in which microprocessor 24 would utilize the protected memory circuit of FIG. 1 is illustrated by the simplified flowchart of FIG. 2. Some event initiates the subroutine for loading data into shift register 10, or conversely, for reading data out of the shift register, such as an impeding power interruption as discussed previously. From the start step 51, control proceeds to step 52 to reset counter 40. This is accomplished by transmitting a suitable pulse over lead 45 to input 41. This resets counter 40 to zero on the possibility that a few counts may have been registered due to interference or spurious signals appearing at input 42 at some previous time. It will be appreciated that the step of resetting counter 40 could also be a step of presetting the counter to a predetermined number, for example in the case of an embodiment that uses a count down counter to reach a predetermined count.

At step 53 the microprocessor generates and delivers a series of pulses on lead 47, corresponding to the predetermined number for the counter. When the predetermined counter is reached, output 43 changes states to enable clock input 13 to shift register 10. At step 54, new data and simultaneously clock pulses are serially applied to inputs 11 and 13, respectively, by the microprocessor to clock new data into shift register 10. In an operation to read out stored data, or in a simultaneous read/write operation, data appearing at output 12 on successive clock pulses may be read into the microprocessor on lead 35. At step 55, counter 40 is again reset as in step 52, and at step 56 the read/write operation is completed.

With counter 40 reset, shift register 10 is locked and immune to interference or spurious pulses applied to input 11, lead 32, or leads 45 or 47 of counter 40, except of course for the improbable event of 128 (or other predetermined number) pulses at input 42 without a reset pulse at input 41. Since this is highly unlikely, the shift register is for all practical purposes locked and the data stored therein is saved for the duration of the power interruption, within the power supply limitations of capacitor 20.

At the end of the power interruption, or upon resumption of operation of the data system, including microprocessor 24, the sequence of steps 51-56 of FIG. 2 may be repeated to recover the stored data.

Figure 3:
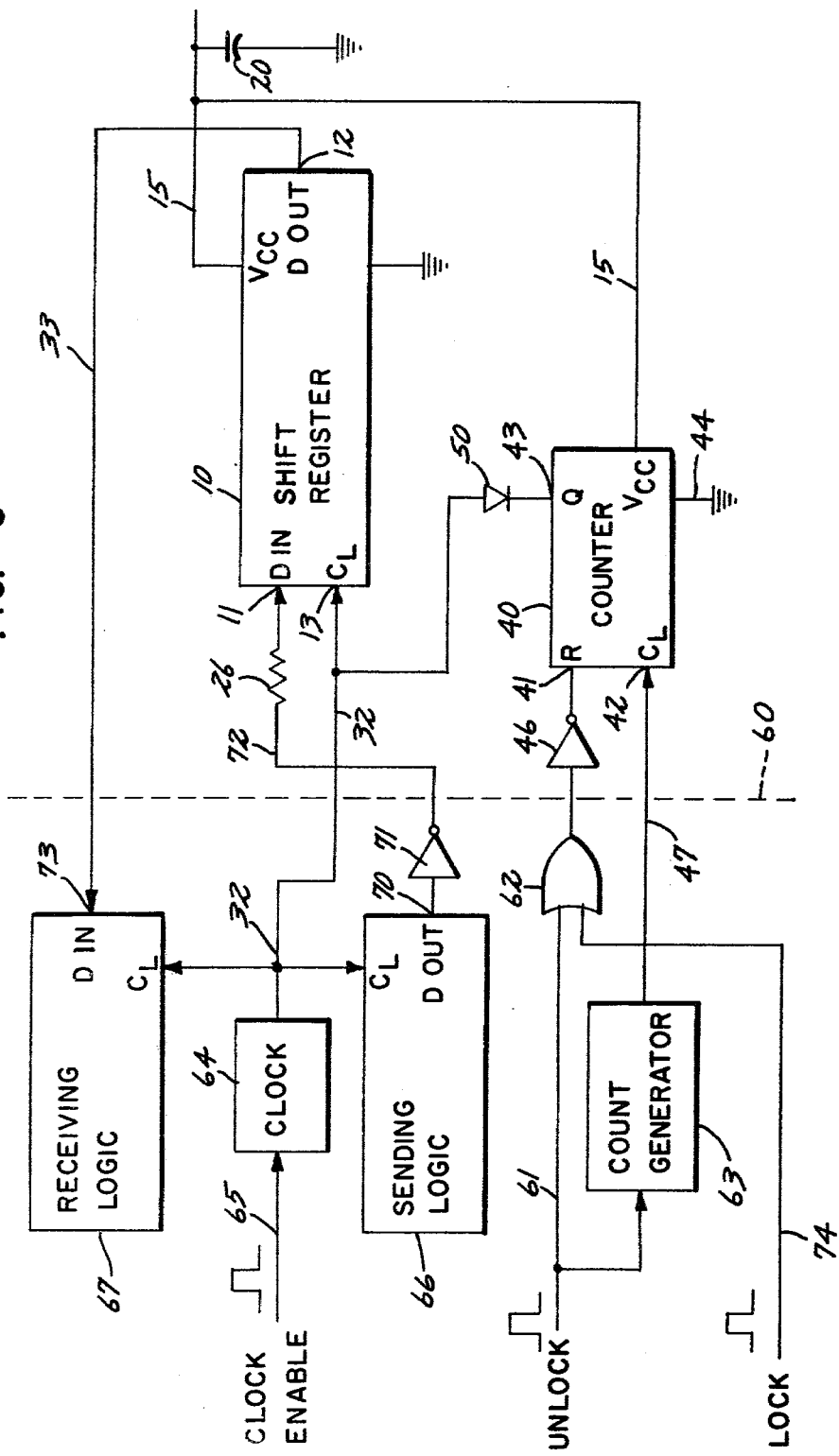
FIG. 3 is a schematic block diagram of the invention as in FIG. 1 illustrating the operation thereof in conjunction with separate logic elements of a data system.

Referring now to FIG. 3, the protected memory circuit of FIG. 1 is shown operating in conjunction with separate logic elements of a data system instead of the microprocessor as in FIG. 1. In FIG. 3, the shift register, counter and associated components to the right of broken line 60 may be the same as the corresponding components in FIG. 1, and they are given identical reference nunbers. In the system of FIG. 3, a data read/write operation for this shift register is accomplished by providing an unlock pulse at lead 61. This pulse passes through OR gate 62 and inverter 46 (if required) to input 41 to reset counter 40. At the same time the unlock pulse triggers count generator 63. This device is designed as generally known in the prior art, in conjunction with counter 40, to produce a predetermined number of pulses corresponding to the predetermined number of counts required to change the output 43 of counter 40 to unlock the shift register. With shift register 10 unlocked, a clock enable signal can be applied to clock 64 via lead 65. Clock 64 then supplies clock pulses on lead 32 to the clock inputs of shift register 10, sending logic 66, and receiving logic 67. Sending logic 66 applies, in serial fashion, the data to be stored in shift register 10. The data is transmitted from the data output 70, through an inverter 71, if required, lead 72 and resistor 26, if required, to data input 11 of shift register 10. Simultaneously, data appearing at the data ouput 12 of the shift register is conveyed by lead 33 to the data input 73 of receiving logic 67.

Thus, with shift register 10 unlocked and enabled through the action of counter 40, data can be clocked from the sending logic to the shift register, and from the shift register to the receiving logic.

When the read/write operation is completed, a lock pulse can be applied on lead 74 which passes through OR gate 62 to reset counter 40 to relock the shift register. In the locked condition, spurious pulses at any of the various inputs will not cause alteration of the data in the shift register, until the predetermined number of counts is again received at the clock input 42 of counter 40 without any intervening reset.

From the foregoing description it will be apparent that the present invention provides a low cost and economical, yet a very effective protected memory for the storage of volatile data, with a very efficient locking means to protect the memory from alternation or loss of data therein due to interference of spurious pulses.

I claim:

1. A protected memory circuit for use with an electronic data system, comprising:
   memory means for storage of electronic data, including input and output means for connection to said system for transfer of data between said memory means and said system;
   means for selectively inhibiting and enabling said memory means with respect to the input or output of data; and
   memory control means connected to said inhibiting and enabling means and adapted to receive control pulses from said system, said memory control means responsive to the receipt of a predetermined plurality of control pulses to enable said memory means for the input or output of data, and operative in the absence of said predetermined number of control pulses to inhibit said memory means.

2. A protected memory circuit according to claim 1 wherein said inhibiting and enabling means includes a clock pulse input circuit associated with said memory means and operative to enable said memory means when a clock pulse is received.

3. A protected memory circuit according to claim 2 wherein said memory control means includes a counter for counting said control pulses, and gate means responsive to said counter for enabling and inhibiting said clock pulses.

4. A protected memory circuit according to claim 1 further including a power supply separate from the power supply of the data system connected for powering said memory means and said memory control means.

5. A protected circuit for storage of volatile data, comprising:
   a shift register memory device having data input and output means for receiving and delivering data, respectively, and a clock input for receiving clock pulses, said shift register operative to store and to shift data stored within in read/write operations upon receipt of clock pulses;
   means for conveying data to said input means for storage and for receiving stored data from said output means during read/write operations;
   means for providing clock pulses for operation of said shift register in read/write operations;
   lock means for selectively enabling and inhibiting read/write operations of said shift register, comprising means for delivering control pulses, a counter connected for counting said control pulses, and gating means responsive to said counter and operatively connected to control application of said clock signals to said shift register, said gating means responsive to a predetermined count in said counter to enable application of said clock signals to said shift register to permit read/write operations, said gating means operative in the absence of said predetermined count to inhibit application of said clock signals, whereby the shift register memory is effectively locked against unwanted or spurious read/write operations.

6. A protection circuit according to claim 5 wherein said counter is adapted to be reset following read/write operations to lock said shift register memory.

7. A protected circuit according to claim 5 wherein said gating means comprises means connected from said counter to said clock input of said shift register for clamping said input to prevent clocking of said shift register in the absence of said predetermined count.

8. A protected circuit according to claim 5 further including a power source connected for powering said shift register means independently of a power supply for a data system with which said protection circuit may be used.

9. A protected circuit according to claim 8 wherein said power source is also connected for powering said lock means.

10. A protected circuit according to claim 9 wherein said power source comprises a storage capacitor connected by a diode to a charging circuit and operative in the event of loss of the charging circuit to continue to supply power to said shift register and said lock means.

* * * * *